United States Patent
Kulkarni et al.

(10) Patent No.: US 7,132,091 B2
(45) Date of Patent: Nov. 7, 2006

(54) SINGLE CRYSTAL SILICON INGOT HAVING A HIGH ARSENIC CONCENTRATION

(75) Inventors: Milind Kulkarni, St. Louis, MO (US); Mohsen Banan, Grover, MO (US); Christopher V. Luers, O'Fallon, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 10/256,759

(22) Filed: Sep. 27, 2002

(65) Prior Publication Data

US 2003/0061985 A1 Apr. 3, 2003

Related U.S. Application Data

(60) Provisional application No. 60/325,622, filed on Sep. 28, 2001, provisional application No. 60/325,660, filed on Sep. 28, 2001.

(51) Int. Cl.
*C01B 33/00* (2006.01)
*C30B 15/04* (2006.01)

(52) U.S. Cl. ............ 423/324; 117/13; 117/19; 117/928; 117/931; 117/932; 117/953

(58) Field of Classification Search .......... 423/324; 117/13, 19, 928, 931, 932, 953
See application file for complete search history.

(56) References Cited

U.S. PATENT DOCUMENTS

| | | | |
|---|---|---|---|
| 2,944,875 A | * 7/1960 | Leverton | ............ 117/213 |
| 4,980,015 A | 12/1990 | Ono et al. | |
| 5,242,531 A | 9/1993 | Klingshirn et al. | |
| 5,408,951 A | * 4/1995 | Tamida | ............ 117/17 |
| 5,492,078 A | 2/1996 | Alterkrüger et al. | |
| 5,587,016 A | 12/1996 | Alterkrüger et al. | |
| 5,779,791 A | * 7/1998 | Korb et al. | ............ 117/15 |
| 5,900,055 A | * 5/1999 | Nagai et al. | ............ 117/33 |
| 6,059,875 A | * 5/2000 | Kirkland et al. | ............ 117/13 |
| 6,059,876 A | * 5/2000 | Yin et al. | ............ 117/19 |
| 6,179,914 B1 | 1/2001 | Aydelott | |
| 6,312,517 B1 | 11/2001 | Banan et al. | |
| 2001/0015167 A1 | 8/2001 | Weber et al. | |

FOREIGN PATENT DOCUMENTS

| | | |
|---|---|---|
| EP | 0 635 588 A1 | 7/1994 |
| EP | 0 635 588 B1 | 7/1994 |
| EP | 0 635 588 A1 | 1/1995 |
| EP | 635588 A1 * | 1/1995 |
| EP | 0 903 429 A2 | 3/1999 |
| FR | 2 038 156 | 1/1971 |
| FR | 2 325 425 | 4/1977 |
| JP | 59156993 | 6/1984 |

(Continued)

OTHER PUBLICATIONS

Notification of Transmittal of the International Search Report or the Declaration for application No. PCT/US02/30991 dated Feb. 17, 2003.

*Primary Examiner*—Yogendra N. Gupta
*Assistant Examiner*—Matt J. Song
(74) *Attorney, Agent, or Firm*—Senniger Powers

(57) ABSTRACT

A single crystal silicon ingot having a constant diameter portion that contains arsenic dopant atoms at a concentration which results in the silicon having a resistivity that is less than about 0.003 Ω·cm.

6 Claims, 6 Drawing Sheets

FOREIGN PATENT DOCUMENTS

| | | |
|---|---|---|
| JP | 61163188 | 7/1986 |
| JP | 61227986 | 10/1986 |
| JP | 62153188 | 7/1987 |
| JP | 05201790 | 8/1993 |
| JP | 06271399 | 9/1994 |
| JP | 9227275 A | 2/1997 |
| WO | WO 97/36024 | 3/1997 |
| WO | WO 99/35310 | 7/1999 |
| WO | WO 01/86033 A1 | 11/2001 |

* cited by examiner

SINGLE CRYSTAL SILICON INGOT HAVING A HIGH ARSENIC CONCENTRATION

CROSS-REFERENCE TO RELATED APPLICATIONS

This application claims the benefit of U.S. Provisional Application Nos. 60/325,622 and 60/325,660, filed Sep. 28, 2001.

BACKGROUND OF THE INVENTION

The present invention generally relates to the preparation of semiconductor grade single crystal silicon, which is used in the manufacture of electronic components. More particularly, the present invention relates to a process for the controlled arsenic doping of single crystal silicon, prepared in accordance with the Czochralski method, in order to achieve low resistivity therein.

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon, and a single crystal is grown by slow extraction. After formation of a neck is complete, the diameter of the crystal is enlarged by decreasing the pulling rate and/or the temperature field in the melt until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter may be reduced gradually to form a conical opposite end. Typically, the opposite end is formed by increasing the crystal pull rate and heat supplied to the crucible. When the diameter becomes small enough, the crystal is then separated from the melt.

Arsenic is a desirable dopant for single crystal silicon grown by the Czochralski method because, due to the high solubility of arsenic in silicon (e.g., about 4% by weight, or about $2\times10^{21}$ atoms per $cm^3$, at about 1100° C.), low resistivities can generally be achieved. Conventionally, the silicon melt is doped by feeding arsenic onto the melt surface from a feed hopper located a few feet above the silicon melt level. However, this approach is not favorable because arsenic is highly volatile and readily vaporizes at temperatures higher than 617° C. Thus, when the arsenic contacts the silicon melt surface, which is at a temperature of about 1400° C., it immediately vaporizes and is lost to the gaseous environment in the crystal puller. Vaporization loss of arsenic vapors to the surrounding environment typically results in the generation of oxide particles (i.e., sub-oxides). These particles can fall into the melt and become incorporated into the growing crystal, which is unfavorable because they can act as heterogeneous nucleation sites and ultimately result in failure of the crystal pulling process (due to a loss of zero-dislocation crystal growth).

The sublimation of arsenic granules at the melt surface often causes a local temperature reduction of the surrounding silicon melt, which in turn results in the formation of "silicon boats" around/beneath the arsenic granules; that is, arsenic sublimation at the melt surface results in localized freezing of the melt surface, causing the formation of solid silicon particles which act as "boats," helping the arsenic granules to float on the melt surface. These silicon boats, along with the surface tension of the melt, thus prevent many of the arsenic granules that do reach the melt surface from sinking into the melt, thus increasing the time during which sublimation to the atmosphere can occur. The inability of the arsenic granules to sink into the melt therefore results in a significant loss of arsenic to the gaseous environment and further increases the concentration of contaminant particles in the growth chamber. In fact, typically only about 40% of the arsenic fed into a crystal pulling apparatus actually dissolves into the silicon melt before being lost to the environment. Thus, an extremely large amount of arsenic must be fed into a crystal pulling apparatus especially when attempting grown a low resistivity crystal.

In view of the foregoing, it can be seen that a need continues to exist in the semiconductor industry for a simple, cost effective approach to produce low resistivity, arsenic-doped single crystal silicon by the Czochralski method.

SUMMARY OF THE INVENTION

Among the features of the invention, therefore, is the provision of single crystal silicon in ingot or wafer form, and a process for the preparation thereof, having decreased resistivity; the provision of such a process wherein decreased resistivity is achieved by means of arsenic-doping of the single crystal silicon; the provision of such a process wherein arsenic, in granular and/or vapor form, is introduced below the silicon melt surface, from which the ingot is grown; and the provision of such a process wherein the concentration of particulate contaminants within the crystal pulling chamber is reduced.

Briefly, therefore, the present invention is directed to a single crystal silicon ingot having a seed end, an opposite end and a constant diameter portion between the seed end and the opposite end, the single crystal silicon ingot being grown from a silicon melt and then cooled from solidification in accordance with the Czochralski method, the single crystal being characterized in that the entire constant diameter portion comprises arsenic at a concentration greater than about $2.24\times10^{19}$ atoms/$cm^3$.

The present invention is also directed to a single crystal silicon wafer comprising arsenic at a concentration greater than about $2.73\times10^{19}$ atoms/$cm^3$.

Further, the present invention is directed to an apparatus for introducing a dopant into a melt of semiconductor source material used to form a monocrystalline ingot of semiconductor material, the melt having a melt surface and an internal melt body below the melt surface, the apparatus comprising a head formed of a material selected for resisting contamination of the melt upon submersion of at least a portion of the head into the melt, the head having a chamber for containing dopant and being adapted to release dopant into the melt after submersion of the head into the melt to thereby dope the melt.

Additionally, the present invention is directed to an apparatus for introducing a dopant into a melt of semiconductor source material used to form a monocrystalline ingot of semiconductor material, the melt having a melt surface and an internal melt body below the melt surface, the apparatus comprising a head formed of a material selected for resisting contamination of the melt upon submersion of at least a portion of the head into the melt, the head comprising a shell, a chamber for containing dopant, an orifice, and a cover over the orifice connected to the shell, the cover being adapted to dissolve into the melt and release dopant into the melt after submersion of the head into the melt to thereby dope the melt.

The present invention is also directed an apparatus for introducing a dopant into a melt of semiconductor source material used to form a monocrystalline ingot of semiconductor material, the melt having a melt surface and an internal melt body below the melt surface, the apparatus comprising a head formed of a material selected for resisting contamination of the melt upon submersion of at least a portion of the head into the melt, the head comprising a shell, a chamber for containing dopant, an orifice, and a cover over the orifice connected to the shell, the cover and shell being adapted to dissolve into the melt and release dopant into the melt after submersion of the head into the melt to thereby dope the melt.

In yet another embodiment, the present invention is directed to an apparatus for introducing a dopant into a melt of semiconductor source material used to form a monocrystalline ingot of semiconductor material, the melt having a melt surface and an internal melt body below the melt surface, the apparatus comprising:
- a head formed of quartz having a plurality of openings for releasing gaseous dopant into the melt after submersion of the head into the melt to thereby dope the melt;
- a container formed of quartz adapted for containing a quantity of solid dopant, the container being in fluid communication with the head for passage of the gaseous dopant from the container in a position away from the melt to the head; and
- a tube formed of quartz connecting the container and the head in fluid communication.

Still further, the present invention is directed to a a process for forming a doped monocrystalline silicon ingot according to the Czochralski method, the process comprising the steps of:
- charging polycrystalline silicon into a crucible within a crystal pulling apparatus;
- heating the polycrystalline silicon to form a silicon melt in the crucible, the silicon melt having a melt surface and an internal melt body below the melt surface;
- introducing a dopant into the silicon melt at a location in the internal melt body below the melt surface;
- vaporizing the dopant;
- dissolving the vaporized dopant into the silicon melt;
- contacting a monocrystalline seed crystal with the melt surface; and
- withdrawing the monocrystalline seed crystal from the melt surface so as to freeze monocrystalline silicon on the seed to form the doped monocrystalline silicon ingot.

Additionally, the present invention is directed to a process for forming an arsenic doped monocrystalline silicon ingot according to the Czochralski method, the process comprising the steps of:
- charging polycrystalline silicon into a crucible within a crystal pulling apparatus;
- heating the polycrystalline silicon to form a silicon melt in the crucible, the silicon melt having a melt surface and an internal melt body below the melt surface;
- introducing arsenic dopant into the silicon melt at a location in the internal melt body below the melt surface with a dopant feeder apparatus;
- vaporizing the arsenic dopant whereby the vaporized arsenic dopant is substantially confined by the dopant feeder apparatus to reduce the amount of arsenic dopant lost to an atmosphere in the crystal pulling apparatus;
- dissolving the vaporized dopant into the silicon melt to yield an arsenic doped melt;
- contacting a monocrystalline seed crystal with the melt surface; and
- withdrawing the monocrystalline seed crystal from the melt surface so as to freeze monocrystalline silicon on the seed to form the arsenic doped monocrystalline silicon ingot.

Other objects will be in part apparent and in part pointed out hereinafter.

DETAILED DESCRIPTION OF PREFERRED EMBODIMENTS

Figure 1:
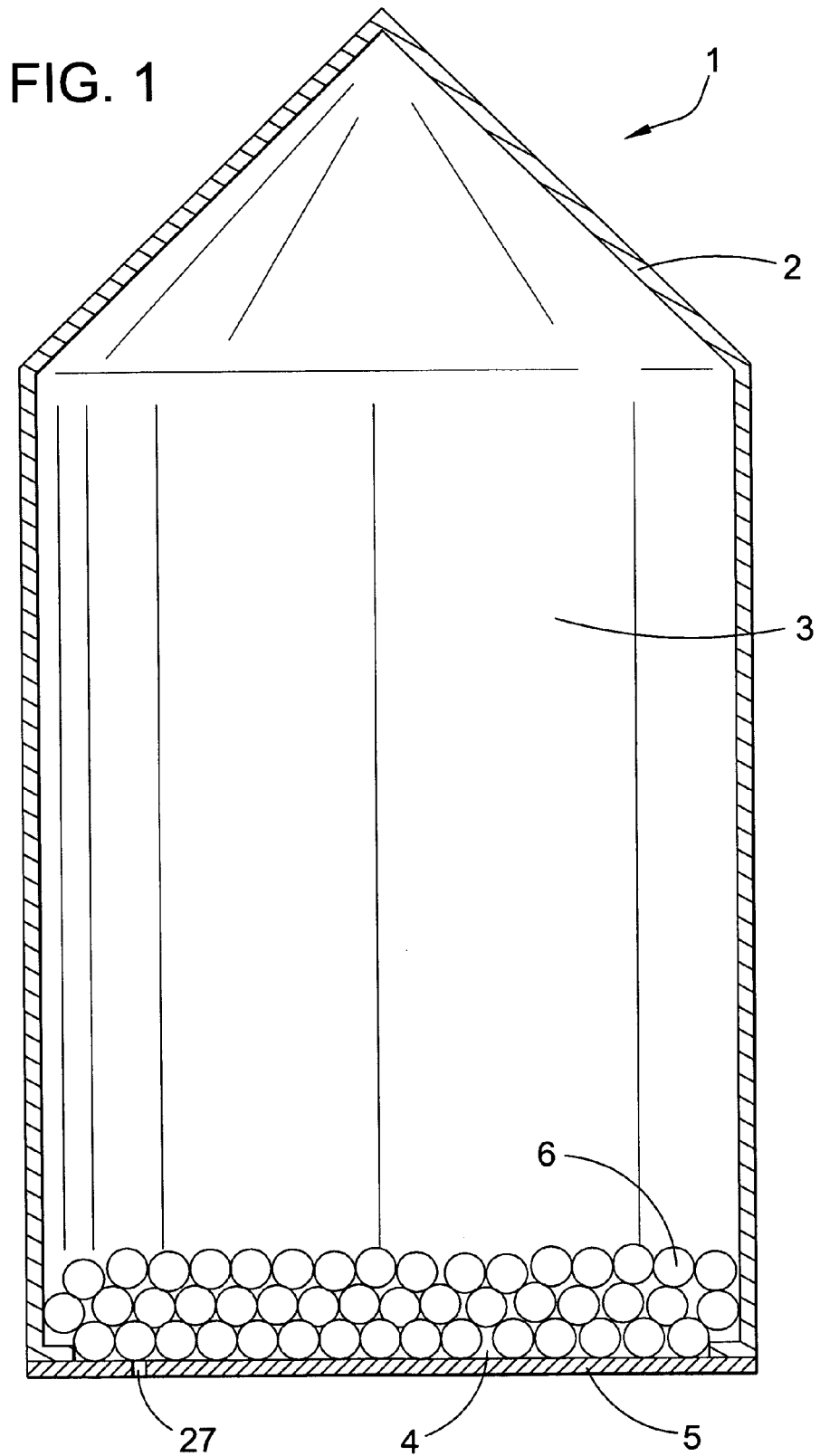
FIG. 1 is a cross-sectional view of a dopant feeder in accordance with an embodiment of the present invention.

In accordance with the present invention, it has been discovered that the introduction of arsenic into the silicon melt can be controlled in a way which enables a much higher arsenic concentration, and thus a much lower silicon resistivity, to be achieved, as compared to methods currently employed in the art. As further described herein, this controlled arsenic doping of the silicon melt is achieved by means of introducing the arsenic granules (arsenic particles) and/or arsenic vapor below the surface of the melt. The present invention additionally enables the number of contaminant particles or the particulate density in the crystal puller to be significantly reduced. As a result, the possibility of process failures, due to the formation of particle-related dislocations and/or the loss of crystal structure for example, are greatly reduced.

Contaminant Particle Formation

Generally speaking, the rate of particle accumulation in the crystal puller equals the rate of particle generation minus the rate of particle removal. The particle removal capacity of the crystal puller, which is a strong function of purge gas (e.g., argon) flow rate, typically remains unchanged during the growth process. Thus, when the rate of contaminant particle generation quickly exceeds the rate of particle removal, the particle density in the crystal puller increases.

Thus, the present invention decreases the rate at which particles accumulate in the crystal puller by decreasing the rate at which particles are generated. In a continuum sense, the total number of particles can be expressed by following equality:

Number of particles=Number of particles initially present+Integral of difference between rate of particle generation and rate of particle removal i.e., $$n = n_0 + \int_0^t \frac{dn}{dt} dt = n_0 + \int_0^t (r_g - r_r) dt = \quad (1)$$
$$n_0 + \int_0^t F(\text{evaporation rate, argon flow rate}) dt$$

where:
- n is the number of particles in the crystal puller;
- $n_0$ is the initial number of particles present;
- t is time (in seconds);
- $r_g$ is the rate of generation of particles;
- $r_r$ is the rate of particle removal; and
- F(evaporation rate, argon flow rate) is a function of arsenic evaporation rate and purge gas flow rate.

In accordance with the present invention, the rate of contaminant particle generation is decreased by controlling the introduction of arsenic granules into the silicon melt, controlling the vaporization of the arsenic granules in the growth apparatus and controlling the dissolution of the arsenic granules into the molten silicon. Thus, the possibility of process failures due to particle-related dislocations or loss of crystal structures is greatly reduced. Additionally, more of the arsenic is incorporated into the melt and growing crystal.

Controlled Introduction of Arsenic Dopant

In accordance with the present invention, a dopant such as arsenic is fed into the silicon melt in a controlled manner rather than merely dropping arsenic granules on the surface of the silicon melt. More specifically, arsenic granules are brought into contact with the silicon melt using an apparatus, or dopant feeder, that introduces the dopant below the melt surface. The dopant feeder comprises a head, of which at least a portion is submersed in the melt. The head comprises a chamber for containing the dopant that is adapted to release dopant (in a solid and/or gaseous state) into the melt after submersion of the head into the melt to thereby dope the melt. It is to be noted that the precise size, shape and configuration of the dopant feeder are not narrowly critical. For example, in one embodiment the dopant feeder is generally cylindrical and/or conical.

In accordance with the process of the present invention, the dopant feeder comprises a head that is brought into contact with the surface of the silicon melt. Accordingly, the feeder is constructed of a material which is compatible with the growth process; that is, the feeder is constructed of a material which will not introduce contaminants into the melt. Additionally, in one embodiment of the present invention, at least a portion of the material used to construct the head is the semiconductor material (e.g., silicon) and dissolves into the melt, also without introducing contaminants therein. Thus, the shell may also be constructed of a material which melts and becomes part of the melt (e.g., silicon), and/or a material which is inert in the silicon melt (e.g., quartz).

Referring now to FIG. 1, in one embodiment the dopant feeder comprises a head 1 which comprises a shell 2 and a chamber 3 for containing dopant. The head 1 is adapted to release dopant into the melt after at submersing at least a portion of the head in the melt. Specifically in this embodiment, to head 1 comprises an orifice 4 and a cover 5 over orifice 4 which is connected to the shell 2 and the cover 5 is made of semiconductor material (e.g., silicon). Optionally, and in a preferred embodiment, the shell 2 is also constructed of semiconductor material. Dopant granules 6 are disposed inside chamber 3 and rest upon the cover 5.

Figure 2:
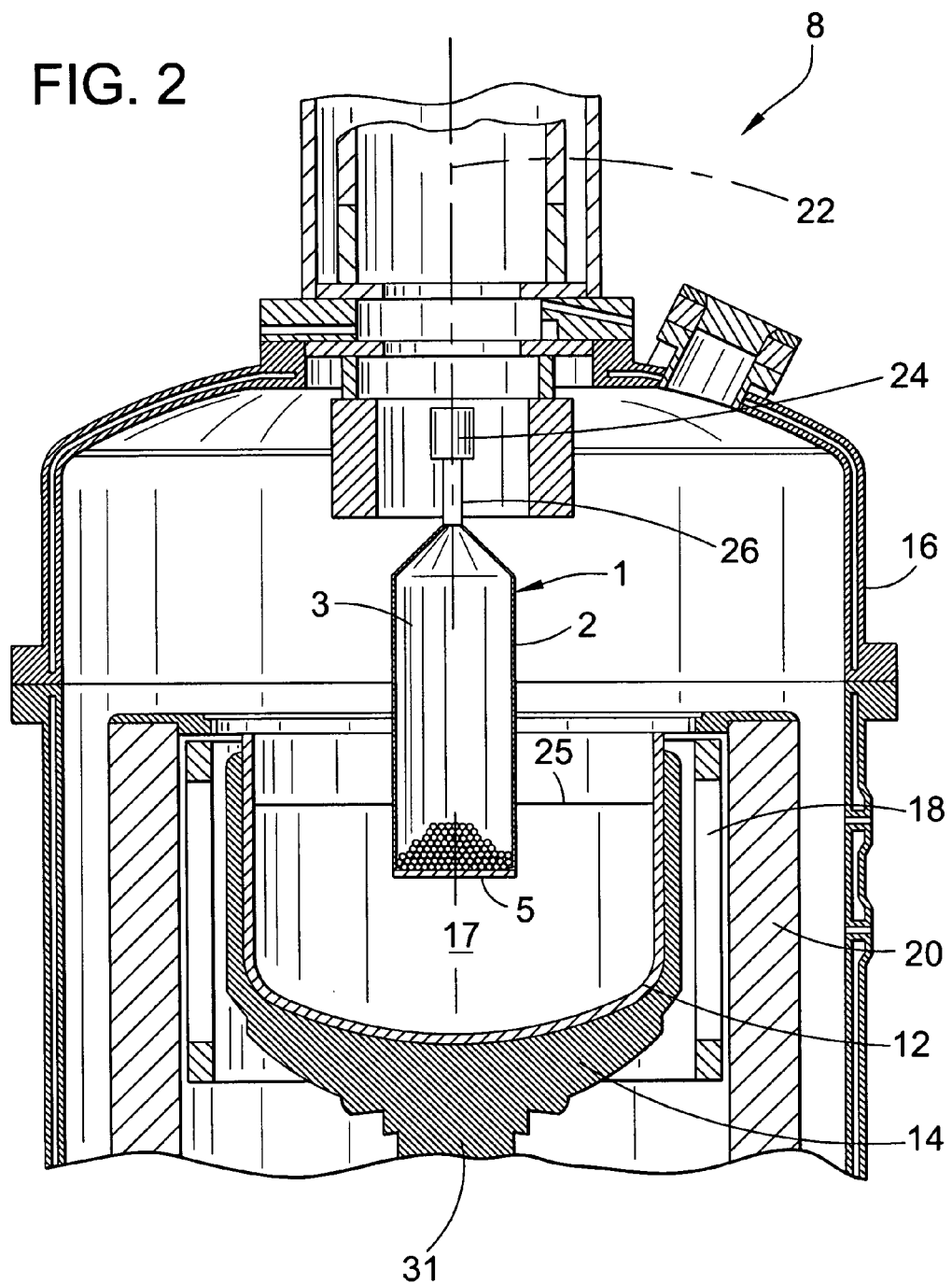
FIG. 2 is a cross-sectional view of a crystal puller showing the doping of a silicon melt in a furnace chamber in accordance with an embodiment of the present invention.

Referring now to FIG. 2, there is shown a crystal pulling apparatus 8 for producing silicon single crystal ingots by the Czochralski method. The crystal pulling apparatus 8 includes a fused silica crucible 12 surrounded by a graphite susceptor 14 and contained within a water-cooled stainless steel growth chamber 16. The crucible 12 holds a polycrystalline silicon melt 17. The silicon melt is provided by adding solid polycrystalline silicon (not shown) to the crucible 12. The solid silicon is melted by heat provided from a heater 18 which surrounds the crucible 12. The heater 18 is surrounded by insulation 20 to retain the heat within the crucible.

In accordance with the present invention, the dopant is introduced by submersing at least a portion of the head below the surface of the silicon melt. Specifically, a crystal pulling shaft or wire 22 supports the head 1 above the silicon melt 17. Preferably, between the pulling shaft or wire 22 and the head 1 is a seed-chuck 24 and a monocrystalline silicon seed 26 that is used to grow the single crystal silicon ingot (see, infra). The head 1 is lowered toward and eventually into the silicon melt 17. The head 1 is heated to a temperature sufficient to melt the cover 5, and optionally, the shell 2 is also melted. Thus, the cover 5, and preferably the shell 2, become part of the silicon melt 17, which allows for the growth process to proceed without the delay of removing the feeder (i.e., the seed crystal 26 remains and growth of the monocrystalline silicon ingot after the dopant is introduced into the melt). In other words, the present method may be used to introduce dopant into the silicon melt below the melt surface using a dopant feeder that is consumed and the silicon ingot can be grown without retracting the pulling wire, introducing the seed crystal into the growth chamber and then lowering the seed crystal into the molten silicon 17.

Eventually, enough of the cover 5 and/or shell 2 dissolves into the melt so that the dopant granules (e.g., arsenic) in the chamber 3, and optionally dopant vapors which have formed inside the chamber, can exit the head 1 and enter the silicon melt 17 below the melt surface 25. Preferably, the arsenic dopant granules have sufficient mass to fall from the cavity to the bottom of the melt, where they continue to sublime, the resulting vapor dissolves into the silicon melt 17. By introducing the arsenic dopant granules below the surface of the melt using the dopant feeder, rather than dropping the arsenic directly onto the melt surface, splashing of the molten silicon is avoided and the formation of suboxide particles is reduced (i.e., the "silicon boat" effect is reduced).

It is to be noted that as the dopant feeder approaches and enters the silicon melt, the temperature of the arsenic dopant granules within the cavity typically exceeds the sublimation temperature, resulting in the formation of vaporous arsenic within the cavity. In order to avoid an explosive release of pressure from the dopant feeder, the dopant feeder preferably comprises an opening through which gaseous arsenic may escape. Preferably, the opening is in the cover (e.g., See FIG. 1 opening 27) and is small enough to prevent the arsenic granules from falling out of the feeder before the feeder penetrates the surface of the silicon melt (e.g., the typical arsenic granule size ranges from about 1 mm to about 3 mm).

Controlling the Vaporization of Solid Arsenic

The method of the present invention also decreases the rate of particle generation and enhances the dissolution of arsenic into the silicon melt by controlling the vaporization of the arsenic dopant granules in the dopant feeder and in the melt. As set forth in Equations 2 through 4, below, one method of controlling the rate of vaporization is to control the total surface area of the arsenic granules per a given mass. So, for $M_{As}=n_{As,1}m_{As,1}=n_{As,2}m_{As,2}$, the following expression may be applied:

$$\frac{S_{As,1}}{S_{As,2}} = \left(\frac{n_{As,1}}{n_{As,2}}\right)^{\frac{1}{3}} \text{ and } \frac{r_{As,1}}{r_{As,2}} = \left(\frac{n_{As,2}}{n_{As,1}}\right)^{\frac{1}{3}} \quad (2)$$

where:

$S_{As,1}$ is the total surface area for a number $n_{As,1}$ arsenic granules of radius $r_{As,1}$;

$S_{As,2}$ is the total surface area for a number $n_{As,2}$ arsenic granules of radius $r_{As,2}$;

$M_{As}$ is the total mass of the arsenic feed and $m_{As,1}$ and $m_{As,2}$ are the mass of an arsenic granule of radius $r_{As,1}$ and $r_{As,2}$, respectively.

The rate of arsenic vaporization may therefore be expressed as:

$$\frac{dM_{As}}{dt} = n_{As}\frac{dm_{As}}{dt} = -n_{As}4\pi D_{As-x}(C_{As-x,eq} - C_{As-xb})r_{As} \quad (3)$$

and, $$\frac{\Delta M_{As,1}}{\Delta M_{As,2}} = -\left(\frac{n_{As,1}}{n_{As,2}}\right)^{\frac{2}{3}} = -\left(\frac{r_{As,1}}{r_{As,2}}\right)^{-2} \quad (4)$$

where:

$n_{As}$ is the total number of arsenic granules of radius $r_{As}$ and of cumulative mass $M_{As}$;

$D_{As-x}$ is the diffusivity of arsenic in the relevant medium (e.g., argon or molten silicon);

$C_{As-x(eq)}$ is the equilibrium concentration of arsenic in the corresponding medium;

$C_{As-x(b)}$ is the bulk concentration of arsenic in the corresponding medium;

$\Delta$ indicates the total change in a variable (e.g., $\Delta M_{As}$ indicates the total change in the arsenic mass or stated another way, the total vaporization).

Thus, by decreasing the surface area for a given mass of arsenic, the vaporization rate is decreased.

In accordance with the present invention, the size distribution of the arsenic dopant granules is selected to minimize the loss of arsenic directly to the argon atmosphere before the feeder is lowered into the silicon melt. The granule size distribution is also selected to maintain a flow of arsenic vapor from the feeder into the silicon melt until the dopant feeder cover dissolves. The size distribution is further selected so that after the feeder cover dissolves and the dopant granules contact the molten silicon, the granules do not vaporize at a rate fast enough to cause the formation of silicon boats (which, although below the melt surface, could still float to the surface and increase the rate of particle generation).

Controlling the Dissolution of Arsenic in the Silicon Melt

Because arsenic vaporizes, it is the resulting vapors which ultimately dissolve into the silicon melt. Therefore, the dissolution of arsenic into the melt may therefore be controlled by controlling the arsenic vapor bubble size, and as a result the gaseous arsenic surface area, in the silicon melt for a given total mass of arsenic vapor. More specifically, for a $M_{As,g}=n_{As,g,1}m_{Asg,1}=n_{As,g,2}m_{As,g,2}$, $$\frac{S_{As,g,1}}{S_{As,g,2}} = \left(\frac{n_{As,g,1}}{n_{As,g,2}}\right)^{\frac{1}{3}} \text{ and } \frac{r_{As,g,1}}{r_{As,g,2}} = \left(\frac{n_{As,g,2}}{n_{As,g,1}}\right)^{\frac{1}{3}} \quad (5)$$

where $S_{As,g,1}$ is the total surface area for $n_{As,g,1}$ number of bubbles of radius $r_{As,g,1}$, $S_{As,g,2}$ is the total surface area for $n_{As,g,2}$ number of bubbles of radius $r_{As,g,2}$, $M_{As,g}$ is the total mass of the arsenic vapor, and $m_{As,g,1}$ and $m_{As,g,2}$ are the mass of an arsenic bubble of radius $r_{As,g,1}$ and $r_{As,g,2}$, respectively.

The rate of arsenic dissolution is given by:

$$\frac{dM_{As,g}}{dt} = n_{As,g}\frac{dm_{As,g}}{dt} = -n_{As,g}4\pi D_{As-m,g}(C_{As-m,eq} - C_{As-m,b})r_{As,g} \quad (6)$$

and $$\frac{\Delta M_{As,g,1}}{\Delta M_{As,g,2}} = -\left(\frac{n_{As,g,1}}{n_{As,g,2}}\right)^{\frac{2}{3}} = -\left(\frac{r_{As,g,1}}{r_{As,g,2}}\right)^{-2} \quad (7)$$

Thus, the arsenic dissolution rate may be increased by decreasing the size of the arsenic bubbles and/or by increasing the number of arsenic bubbles. A small bubble size increases the contact area per given amount of arsenic gas and thereby increases the rate at which the arsenic dissolves into the silicon melt.

Controlling the bubble size also allows the bubble rise velocity in the melt to be controlled so that dissolution of the arsenic is enhanced. Specifically, because the bubble rise velocity increases with bubble size, a larger arsenic bubble will rise toward the surface faster and is more likely to escape from the melt into the argon atmosphere, because it has less time to dissolve in the melt. In contrast, a smaller arsenic bubble rises toward the surface at a slower rate and is therefore more likely to be retained within the melt for a longer duration. As a result, more of the arsenic will be dissolved within the silicon melt.

Figure 3:
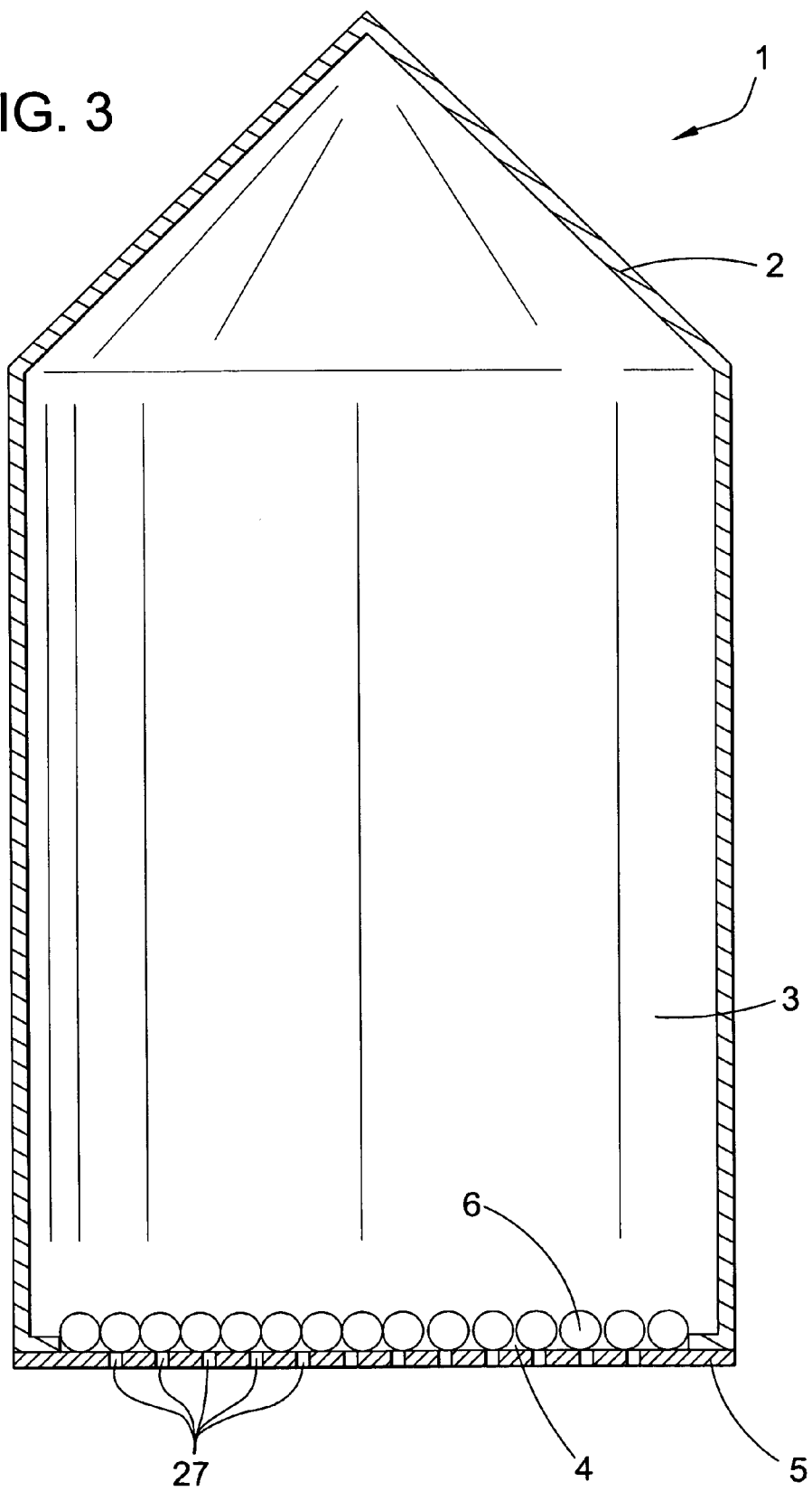
FIG. 3 is a cross-sectional view of a dopant feeder in accordance with an embodiment of the present invention.

Referring now to FIG. 3, in one embodiment of the present invention, the cover 5 of the feeder 1 comprises a plurality of openings 27 through which gaseous arsenic, and optionally granular arsenic, escapes directly from the chamber 3 into the molten silicon. The openings in the cover have a width which is sufficient to create and introduce arsenic bubbles into the silicon melt of a diameter and number which maximizes the residence time of the bubbles, thus maximizing arsenic concentration, in the melt. Typically, such bubbles will have a diameter that is less than about 2 mm, preferably less than about 1 mm, more preferably less than about 0.5 mm, and even more preferably less than about 0.1 mm.

In this regard It is to be noted that the terms "openings" and "holes" may be used interchangeably herein and both refer to the open passageways in the cover 5. Additionally, it will be recognized by one skilled in the art that the openings, generally referred to as holes throughout, could be squares, slots, diamond shapes, or any other shapes allowing solid and/or fluid flow therethrough.

As described above, the arsenic granules preferably remain within the dopant feeder until after the feeder is lowered into the silicon melt. However, unlike the solid cover embodiment, a cover with a plurality of openings may be designed to release arsenic granules into the melt before the cover completely dissolves into the melt. Specifically, the width(s) of the openings may be selected such that as the arsenic granules decrease in size through evaporation and/or the openings increase in size through dissolution, the arsenic granules are able to pass through the openings and enter the silicon melt.

Figure 4:
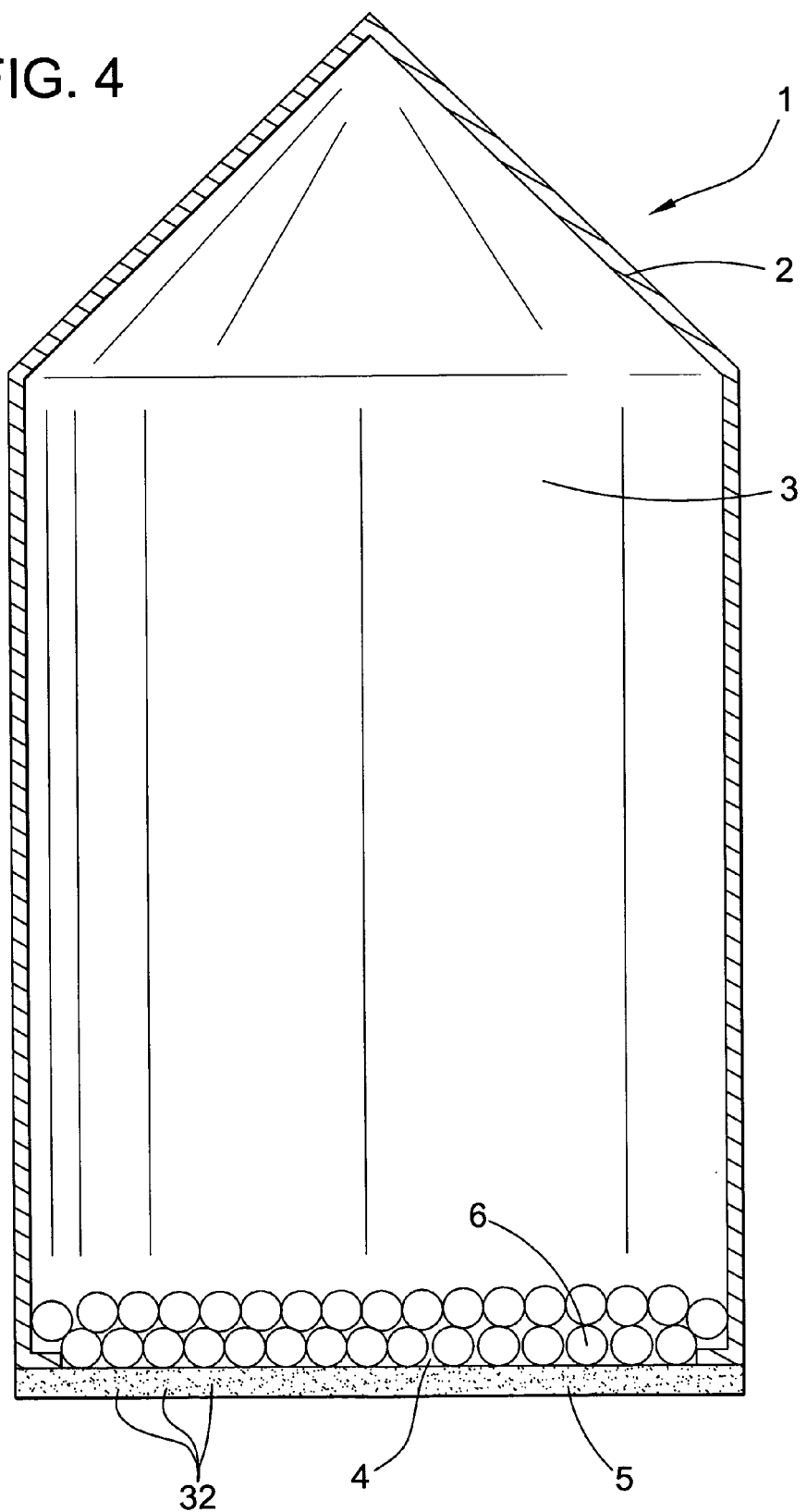
FIG. 4 is a cross-sectional view of a dopant feeder in accordance with an embodiment of the present invention.

Referring now to FIG. 4, in another embodiment of the present invention, the cover 5 comprises a plurality of openings through which the gaseous arsenic escapes. However, unlike the embodiment depicted in FIG. 3, the gaseous arsenic does not directly escape through a single passageway in the cover. Rather, the gaseous arsenic escapes from the chamber 3 through interconnected pathways 32 in the cover 5. For example, a cover 5 that resembles a filter may be formed by partially sintering silicon particulate. Advantageously, such a filter-like cover enables the formation of significantly smaller bubble diameters. Care should be taken, however, to design the filter-like cover with a sufficient porosity to ensure an adequate release of arsenic vapor pressure from the head.

Figure 5:
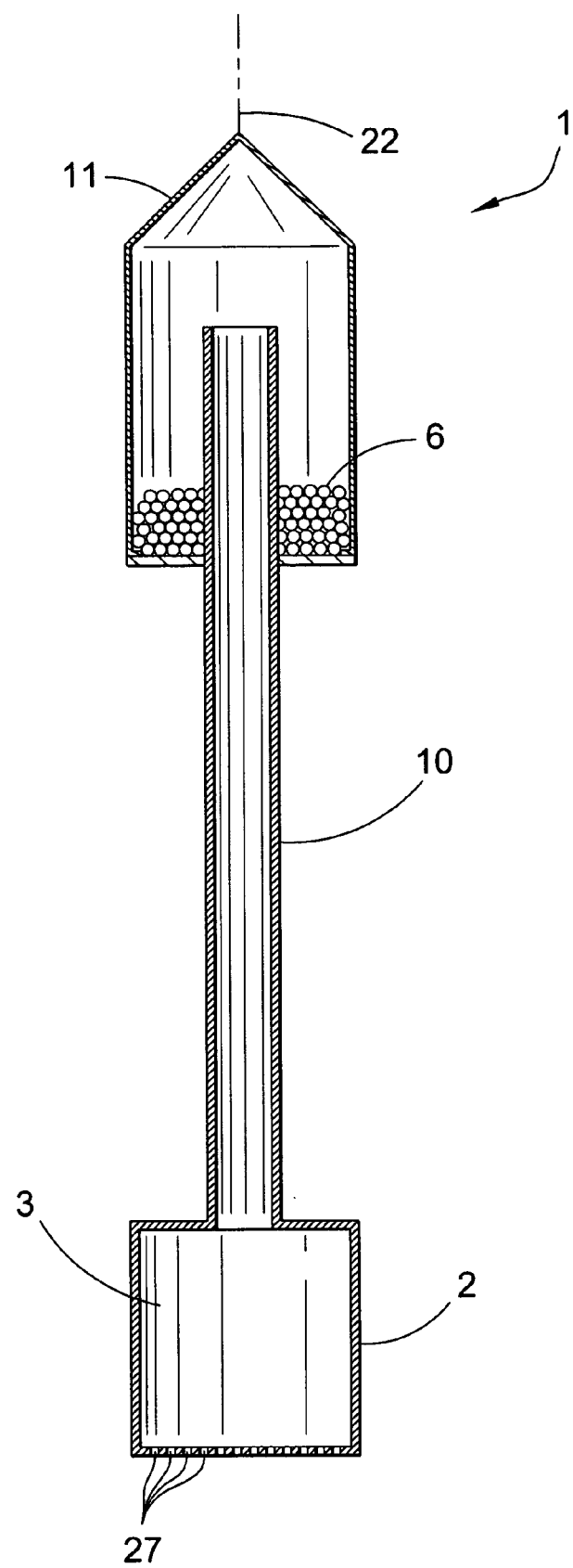
FIG. 5 is a cross-sectional view of a dopant feeder in accordance with an embodiment of the present invention.

Referring to FIG. 5, in another embodiment of the present invention, the dopant feeder 1 comprises a head 7 having a chamber 3 for containing dopant and being adapted to release dopant into the melt after submersion of the head into the melt. More specifically, the head 2 comprises plurality of openings 27 for releasing arsenic vapor from the head into the melt below the surface of the melt. The dopant feeder also comprises a container 11 adapted for containing a quantity of dopant 6, the container being in fluid communication with the head for passage of a dopant from the container in a position away from the melt to the head and into the melt below the melt surface. Preferably, the dopant feeder also comprises a tube 10 connecting the container and the head in fluid communication. Thus, the container blocks fluid transfer from the container except through the tube.

In this particular embodiment, the size distribution of the dopant particles is preferably selected to maintain a flow of arsenic vapor from the feeder into the silicon melt until the dopant feeder is withdrawn from the silicon melt. Withdrawal of the feeder from the melt prior to complete depletion of the solid arsenic is critical to present invention because if the vapor pressure in the feeder becomes too low a back suction of silicon melt into the feeder can occur. The molten silicon drawn into the feeder can then cool, solidify and expand which can break or distort the feeder. The height of the melt climb is given by the following equation:

$$h = \frac{p_0 - p_i}{\rho_m g} = \frac{p_0 - x_{As,m} p_{vap}}{\rho_m g} \qquad (8)$$

where:
$p_0$ is the argon ambient pressure;
$p_i$ is the pressure inside the feeder;
$\rho_m$ is the density of the melt;
$x_{As,m}$ is the arsenic mole fraction in the melt;
$p_{vap}$ is the vapor pressure of the arsenic; and
g is the gravitational constant.

Therefore, it is important to withdraw the feeder from the melt while the vapor pressure inside the feeder is greater than the pressure of the argon ambient pressure.

In addition to controlling the vaporization of arsenic through the selection of the particle size distribution, the vaporization may be controlled by controlling the temperature of the arsenic granules within the dopant container of the dopant feeder. Specifically, the vaporization increases with the temperature and the temperature of the dopant granules therein is largely dependent upon the vertical position of the dopant container within the crystal growth apparatus—the temperature is higher nearer the silicon melt and lower away from the melt. Thus, if an increase or decrease in the vaporization of the arsenic is desired the position of the dopant feeder in the growth chamber may be adjusted and/or the distance between the dopant container and the silicon melt can be adjusted.

The dissolution of arsenic vapor into the melt may also or additionally be controlled by controlling the convective currents within the melt which affects the arsenic coefficient. For example, manipulating heater profiles to increase convective currents within the melt increases the dispersion coefficient of the arsenic within the melt. It should be noted, however, that creating convective flows which provide greater mixing of the arsenic bubbles may decrease the residence time of the bubbles in the melt.

Growing an Arsenic Doped Single Crystal Silicon Ingot

Figure 6:
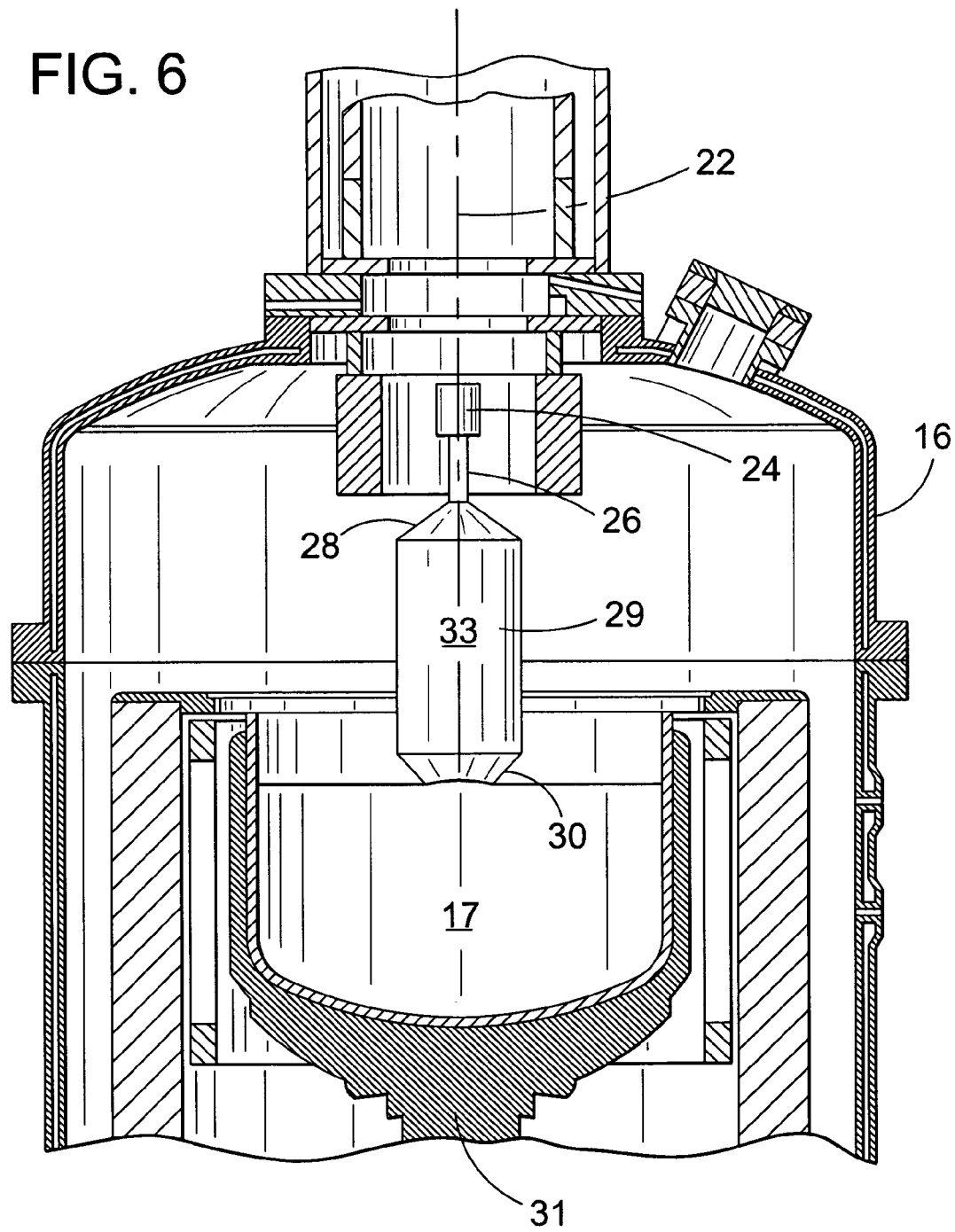
FIG. 6 is a cross-sectional view of a crystal puller showing the growth of a doped silicon ingot in accordance with the Czochralski method.

Referring to FIG. 6, the dopant feeder is either dissolved into the melt or withdrawn from the melt and a pulling wire 22 using a monocrystalline seed crystal 26 and seed-chuck 24 lower the seed crystal to the melt surface. After thermal equilibration of the seed, the pulling wire 22 is then retracted withdrawing the seed 26 from the molten silicon 17. As the seed 26 is withdrawn, the liquid silicon from the melt solidifies around the seed in a single crystal (monocrystalline silicon) above the melt 17. The pulling wire 22 from which the formed single crystal is suspended is continuously retracted from the melt as it rotates, forming a substantially cylindrical crystal 33 as in a conventional Czochralski process. The pull rate is decreased creating an outwardly flaring region or seed end 28 typically referred to as the cone of the crystal. When the desired diameter is obtained, the pull rate and other growth conditions are controlled to provide a substantially constant diameter portion 29 between the seed end 28 and the opposite end 30 of the crystal 33.

While the single crystal 33 is being pulled, the crucible 12 is rotated via a shaft 31 in a direction opposite that of the crystal 33. As the single crystal 33 grows, the crucible 12 is raised within the growth chamber 15 to compensate for depletion of the silicon melt 16. When the melt is nearly depleted, the process variables are adjusted to decrease the crystal diameter resulting in the formation of a conical opposite end 30 of the crystal 33. Once the diameter of the opposite end 30 is sufficiently small, generally 2 mm to 4 mm, detachment of the crystal 33 from the silicon melt can be accomplished without causing dislocations to spread to the main body of the crystal. The single crystal ingot 33 is then removed from the growth chamber 16 and processed to form silicon wafers.

When growing an arsenic doped silicon ingot, the concentration of arsenic in the ingot typically increases as a function of length. This phenomenon is due primarily to the fact that solubility of arsenic in solid silicon is less than the solubility of arsenic in molten silicon. Specifically, the segregation coefficient, κ, for arsenic in silicon is 0.3 (κ=$C_{solid}$/$C_{liquid}$, $C_{solid}$ and $C_{liquid}$ change as a function of time because the relative volumes of the solid and liquid changes as function of time). Thus, there is a gradient of dopant across the length of the ingot such that $C_{solid,\ seed-end}$ is smaller than $C_{solid,\ tail-end}$ ($C_{solid,\ location}$=κ$C_0$(1−X)$^{K-1}$ where $C_0$ is the initial dopant concentration in the melt and X is the fraction of the melt that has solidified).

The present invention which allows for controlling the introduction and vaporization of the arsenic when doping the silicon melt enables the growth of silicon ingots which have a concentration of arsenic that is at least about $2.24 \times 10^{19}$ atoms/cm$^3$ over the entire length of the ingot (i.e., from the seed-end to the tail-end), which typically corresponds to resistivity of about 0.003 Ω·cm (ohm·centimeters) at about 300 K. Preferably, the concentration of arsenic is at least about $2.73 \times 10^{19}$ atoms/cm$^3$ over the entire length of the ingot, which typically corresponds to a resistivity is less than about 0.0025 Ω·cm across the entire length of the ingot. Because of segregation, the concentration of arsenic at the tail end will be greater than at the seed end so the concentration may be greater than about $3.48 \times 10^{19}$ atoms/cm$^3$ (a resistivity less than about 0.002 Ω·cm), and in some instances, may be greater than about $4.74 \times 10^{19}$ atoms/cm$^3$ (a resistivity less than about 0.0015 Ω·cm).

In view of the above, it will be seen that the several objects of the invention are achieved and other advantageous results attained. As various changes could be made in the above invention, it is intended that all matter contained in the above description and shown in the accompanying drawings shall be interpreted as illustrative and not in a limiting sense.

What is claimed is:

1. A single crystal silicon ingot having a seed end, an opposite end and a constant diameter portion between the seed end and the opposite end, the single crystal silicon ingot being grown from a silicon melt and then cooled from solidification in accordance with the Czochralski method, the single crystal being characterized in that the entire constant diameter portion comprises arsenic at a concentration greater than about $2.73 \times 10^{19}$ atoms/cm$^3$.

2. The single crystal silicon ingot as set forth in claim wherein the entire constant diameter portion has a resistivity that is less than about 0.0025 Ω·cm at about 300 K.

3. The single crystal silicon ingot as set forth in claim wherein the concentration of arsenic at about the opposite end is greater than about $3.48 \times 10^{19}$ atoms/cm$^3$.

4. The single crystal silicon ingot as set forth in claim 3 having a resistivity at about the opposite end that is less than about 0.002 Ω·cm at about 300 K.

5. The single crystal silicon ingot as set forth in claim wherein the concentration of arsenic at about the opposite end is greater than about $4.74 \times 10^{19}$ atoms/cm$^3$.

6. The single crystal silicon ingot as set forth in claim 5 having a resistivity at about the opposite end that is less than about 0.0015 Ω·cm at about 300 K.

* * * * *